United States Patent [19]

Jenkins et al.

[11] Patent Number: 5,179,345
[45] Date of Patent: Jan. 12, 1993

[54] METHOD AND APPARATUS FOR ANALOG TESTING

[75] Inventors: Leslie C. Jenkins, Holmes; Robert L. Wisnieff, Yorktown, both of N.Y.

[73] Assignee: International Business Machines Corporation, Armonk, N.Y.

[21] Appl. No.: 450,635

[22] Filed: Dec. 13, 1989

[51] Int. Cl.[5] ............................................. G01R 27/26
[52] U.S. Cl. ..................................... 324/678; 324/658
[58] Field of Search ............... 324/537, 658, 676, 678, 324/677, 663; 307/359, 353; 328/128; 350/330, 331 R, 332-334; 359/59, 84, 86

[56] References Cited

U.S. PATENT DOCUMENTS

| | | | |
|---|---|---|---|
| 4,187,459 | 2/1980 | Wolfendale | 324/678 X |
| 4,458,196 | 7/1984 | Goyal et al. | 324/676 X |
| 4,488,299 | 12/1984 | Fellhauer et al. | 371/20 |
| 4,583,042 | 4/1986 | Riemer | 324/73 |
| 4,649,339 | 3/1987 | Grangroth et al. | 324/158 F |
| 4,743,840 | 5/1988 | Sato et al. | 324/73 |
| 4,744,084 | 5/1988 | Beck et al. | 371/23 |
| 4,767,997 | 8/1988 | Nielsen | 307/353 X |
| 4,819,038 | 4/1989 | Alt | 357/4 |
| 4,940,934 | 7/1990 | Kawaguchi et al. | |

FOREIGN PATENT DOCUMENTS

| | | |
|---|---|---|
| 0231763 | 8/1987 | European Pat. Off. |
| 0290066 | 11/1988 | European Pat. Off. |
| 3413849 | 8/1985 | Fed. Rep. of Germany |

OTHER PUBLICATIONS

"Measurement of Minimum-Geometry MOS Transistor Capacitances" by John J. Paulos, and Dimitri, A. Antoniadis, IEEE Transactions on Electron Devices, vol. ED-32, No. 2, Feb. 1985.
Nagae et al., Smectic Liquid Crystal Flat Display with Light Pen and Readout Functions, IEEE Trans. on Electron Devices, Apr. 1985, p. 744.
Woo, Validating Functional Correctness of Incomplete Circuits . . . , IEEE Conference on ICCAD, No. 11–13, 1986, Dig. of Techn. Papers pp. 302–305, Nov. 1986.

*Primary Examiner*—Jack B. Harvey
*Attorney, Agent, or Firm*—Bernard E. Shay; David Aker

[57] ABSTRACT

A sense circuit for detecting charge on a TFT/LCD cell capacitor, which comprises a first, integrating circuit attached to the TFT/LCD cell capacitor through a data line, wherein the data line is connected to the cell capacitance through a thin film transistor. The thin film transistor including a gate, a drain and a source, wherein the source is connected to the cell capacitor and the drain is connected to the data line. A first, gate supply voltage adapted to drive the gate of the thin film transistor. And a reset circuit adapted to reset the integrating circuit. This embodiment may further include a source for charging said cell capacitor prior to measuring the charge. Further, a method of testing a partially constructed electronic circuit, for example the cell of an LCD, prior to installation of the backplate. The partial circuit comprising an array of contact electrodes, for example cell pad electrodes and an array of address electrodes, for example gate electrodes. The address electrodes being electrically connected to the contact electrodes. The method comprising the steps of providing the partial circuit with a test electrode, for example an adjacent data electrode extending alongside but spaced from at least a first contact electrode; and measuring the capacitance between the first contact electrode and the test electrode.

28 Claims, 7 Drawing Sheets

METHOD AND APPARATUS FOR ANALOG TESTING

The present invention relates, in general, to a method and apparatus for testing Thin Film Transistor, Liquid Crystal Display Arrays and, more particularly to a method and apparatus for placing a charge on a TFT/LCD cell capacitor and measuring the charge retained on the capacitor after a brief period.

BACKGROUND OF INVENTION

It is desirable to test all cells in a liquid crystal display (LCD) prior to assembling the array into a Liquid Crystal Display Panel. This eliminates alignment, assembly and filling costs for rejected arrays. A cell normally comprises a thin film transistor (TFT), and a pad which may be modeled electrically as one side of a capacitor. Thus, electrically, the cell appears to be a TFT with a series cell capacitance attached to its source. Since, it is extremely expensive and time consuming to test each cell in the array, individual cells, located at test sights on the border of the array are normally used to conduct preassembly tests. Because this test does not check for bus continuity, individual transistor functionality, or contact to the indium-tin oxide (ITO) pad, arrays that pass the this type of preassembly test may still fail to produce acceptable displays. It would, therefore, be advantageous to provide a method and apparatus for quickly and economically testing each cell in the array to assure that it is operational. It would also be advantageous if the method and apparatus provided information on the operational characteristics of individual cells. Normally, when testing prior to assembly, the front plate of the display is not in place, which reduces the cell capacitance and makes measuring charge stored thereon more difficult.

Conventional methods of testing individual elements of the array involve mechanically probing the array. For example, the source and drain pads may be accessed using a mechanical probe. Once the source and drain pads are accessed, the status of individual TFT's may be determined. Unfortunately, this method of testing is extremely time consuming and may physically damage the array. Therefore, testing of display cell transistors is presently done of experimental small area arrays using mechanically positioned probes. It would, therefore, be advantageous to test all transistors, ITO contacts, gate and drain lines on a large array without the front plate (counterelectrode) in place. It would further be advantageous to test each individual element of the array and obtain useful analog information without physically contacting any portion of the cell being tested.

SUMMARY OF THE INVENTION

In one embodiment of the present invention a sense circuit for detecting charge on a TFT/LCD cell capacitor, comprises a first, integrating circuit attached to the TFT/LCD cell capacitor through a data line, wherein the data line is connected to the cell capacitance through a thin film transistor. The thin film transistor includes a gate, a drain and a source, wherein the source is connected to the cell capacitor and the drain is connected to the data line. A first, gate supply voltage is adapted to drive the gate of the thin film transistor, and a reset circuit is adapted to reset the integrating circuit. This embodiment may further include means for charging said cell capacitor prior to measuring the charge, such as for example, an adjustable supply voltage switchably attached to the data line.

More particularly, a thin film transistor test circuit apparatus is described, including an input terminal and an output terminal, an operational amplifier including non-inverting and inverting input terminals and an output terminal. The output terminal is connected to the output terminal of the test circuit and the non-inverting terminal is connected to a ground potential. An integrating capacitor is connected between the inverting terminal and the output terminal. A first switch is connected between a first potential and the test circuit input terminal. The test circuit is connected to the inverting input terminal. A reset circuit is connected across the integrating capacitor, between the inverting input terminal and the test circuit output terminal.

The present invention further includes a method of testing a partially constructed electronic circuit, for example the cell of an LCD prior to installation of the front plate. The partial circuit comprising an array of contact electrodes, for example cell pad electrodes and an array of address electrodes, for example gate electrodes. The address electrodes are electrically connected to the contact electrodes. The method comprising the steps of providing the partial circuit with a test electrode, for example an adjacent data electrode extending alongside but spaced from at least a first contact electrode; and measuring the capacitance between the first contact electrode and the test electrode.

The invention further includes a method of testing thin film transistors having a gate, a source and a drain, using the test circuit described above, wherein the gate is connected to a gate terminal through a gate line. The drain is connected to the test circuit through a data line. The source is connected to a liquid crystal cell capacitor pad through a source terminal. The method comprises a series of steps including resetting the integrator, closing the third switch, and closing the first switch to initiate the process; waiting a first predetermined time period, corresponding to at least a time constant of the data line, applying a voltage to the gate terminal sufficient to bias the transistor on, waiting a second predetermined time period corresponding to at least the test time period (i.e. the charge time of the cell) for the thin film transistor to charge the cell capacitance, and applying a voltage to the gate terminal sufficient to bias the transistor off. Once the transistor is biased off, it is held off for a period of time corresponding to the hold time of a cell during normal operation. During this period, the test circuit is reset to prepare the integrator to measure the charge stored on the cell. The charge is measured by applying a voltage to the gate sufficient to turn the transistor on, waiting a predetermined time which is at least sufficient to transfer charge from the cell capacitor to the charge integrating operational amplifier, applying a voltage to the gate sufficient to turn the transistor off, waiting a predetermined time corresponding to the RC time constant of the gate line, and sampling the voltage at the output node.

BRIEF DESCRIPTION OF THE DRAWINGS

The novel features of the invention are set forth with particularity in the appended claims. The invention itself, however, both as to organization and method of operation, together with further objects and advantages thereof, may best be understood by reference to the following description taken in conjunction with the accompanying drawings in which:

DESCRIPTION OF THE PREFERRED EMBODIMENTS

The present involves a method of characterizing individual cells within a Thin Film Transistor/Liquid Crystal Display (TFT/LCD) array. The method provides an indication of the state of each transistor along with information on the threshold voltage and transconductance of the transistor. In addition, the leakage current and $C_{GS}$ of each cell may be measured. The present method is useful for failure analysis, process variation and production line tests.

Figure 1:
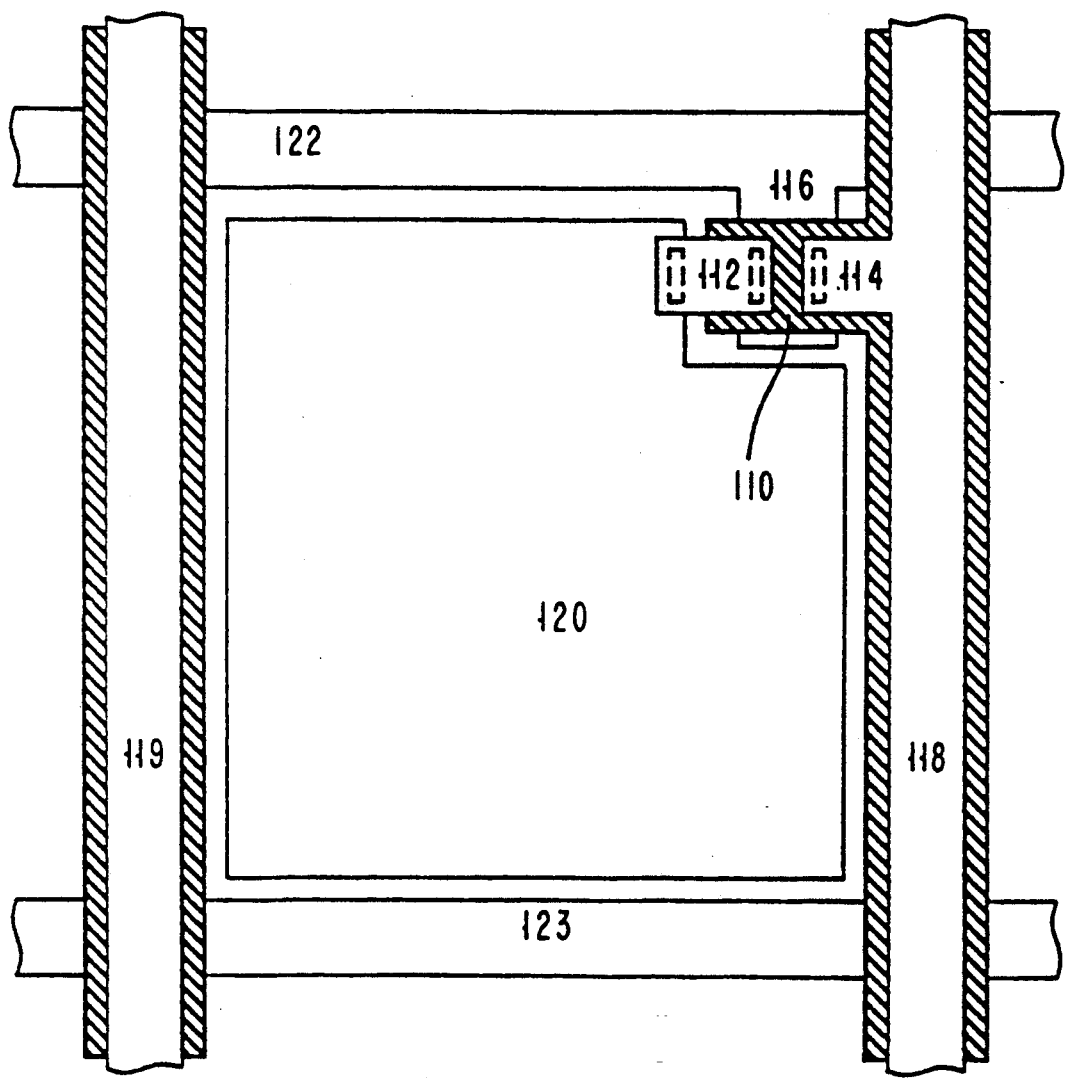
FIG. 1 illustrates a typical TFT/LCD cell.

In FIG. 1, a Thin Film Transistor (TFT) 110 includes source contact 112, drain contact 114 and gate contract 116. Source contact 112 supplies Liquid Crystal Display (LCD) pad 120 which may be comprised of, for example, Indium Tin Oxide (ITO). Drain contact 114 is connected to data line 118. Gate contact 116 is connected to gate line 122. The combination described is referred to as a cell. A TFT/LCD array comprises many such cells. Each cell is addressable by means of a unique gate line/data line combination. Thus, each cell may be individually accessed and tested. Gate line 123 and data line 119 may be used to access a unique cell site not illustrated in FIG. 1.

Figure 2:
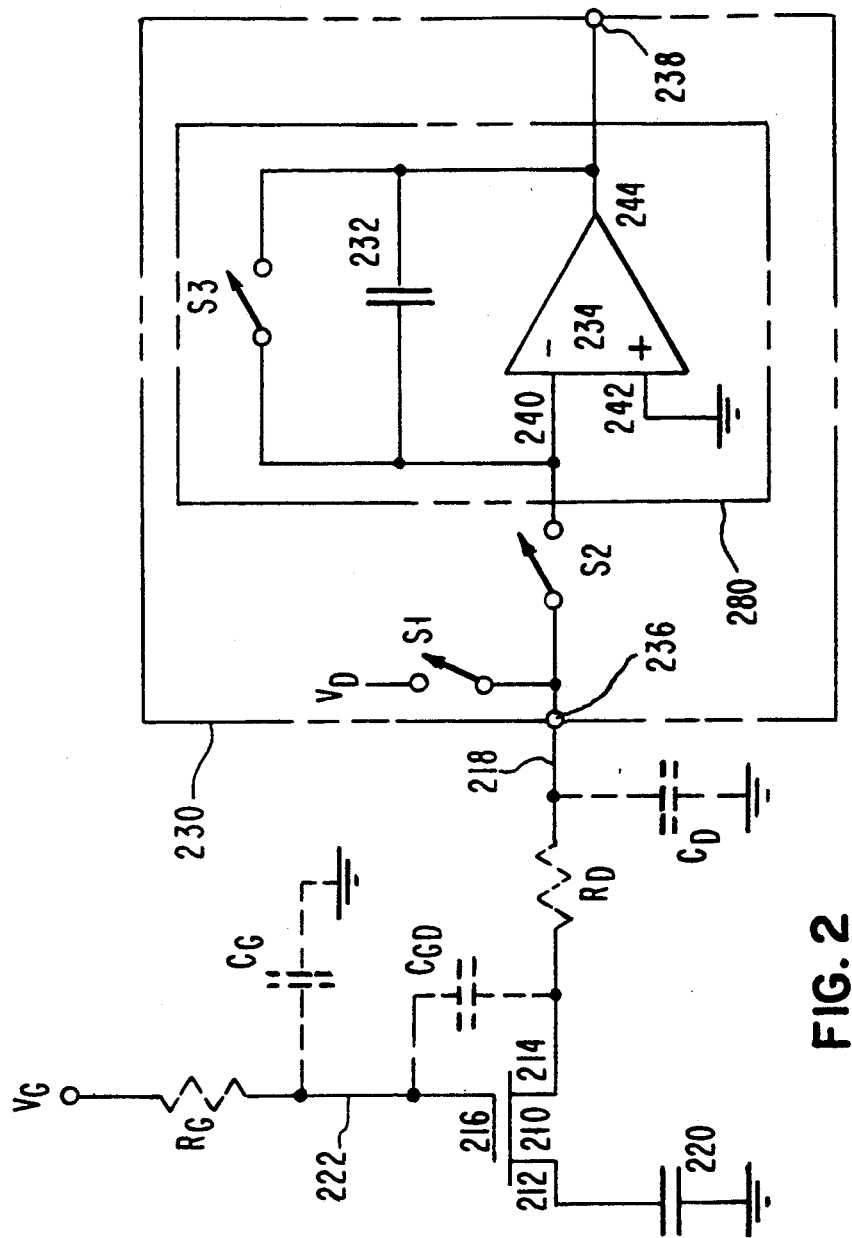
FIG. 2 illustrates a schematic diagram of one embodiment of the present invention, including a schematic diagram of a typical TFT/LCD cell.
Figure 7:
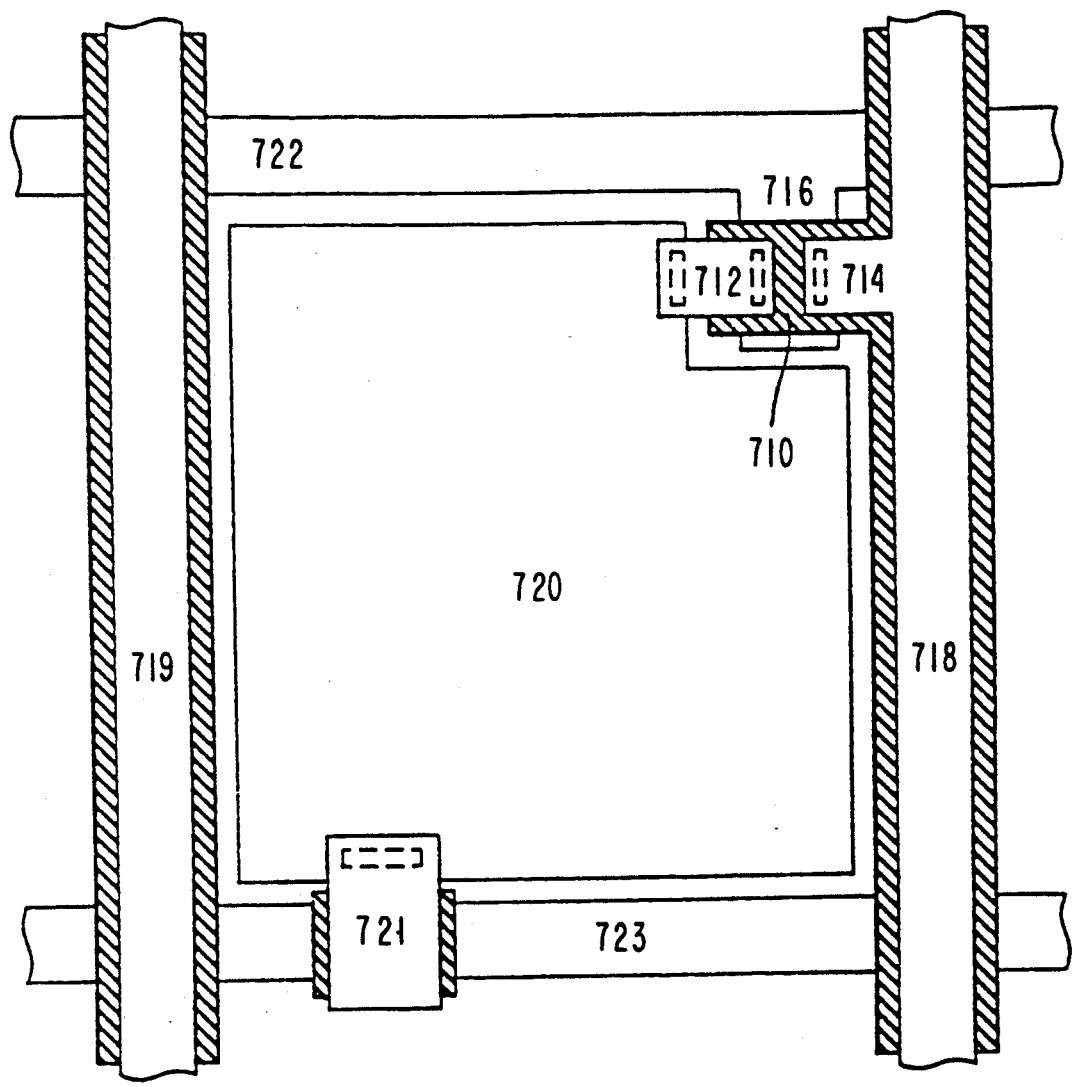
FIG. 7 illustrates a typical TFT/LCD cell including a storage capacitor.

FIG. 2 is a schematic of one preferred embodiment of the present invention attached to a typical TFT/LCD cell. A TFT/LCD cell, similar to the cell described with respect to FIG. 1, is illustrated in FIG. 2 in schematic form. In FIG. 2, a Thin Film Transistor (TFT) 210 includes source contact 212, drain contact 214 and gate contact 216. Source contact 212 supplies the Liquid Crystal Display (LCD) pad which is represented schematically in FIG. 2 by capacitor 220. It will be noted that some TFT/LCD cells include storage capacitance in parallel with the LCD pad (see capacitor 721 in FIG. 7). These storage capacitors may, therefore, contribute to the capacitance of capacitor 220. Drain contact 214 is connected to data line 218. Gate contact 216 is connected to gate line 222. $C_{GD}$ in FIG. 2 represents the gate-drain capacitance of transistor 210.

To test individual cell transistors without the presence of the front plate, it is necessary to detect the magnitude of charge stored on the parasitic capacitance of LCD pad 120. Consider the individual cell detail of a typical large display array as shown in FIG. 1. In the cell illustrated in FIG. 1, LCD pad 120 is the only connection to the transistor source. Parasitic capacitance from the pad to the adjacent gate and drain lines are included in the capacitor 220 as illustrated in FIG. 2.

A sensing circuit 230, according to the present invention, which is capable of measuring small change quantities with good resolution, is illustrated in FIG. 2. In this embodiment, operational amplifier 234, capacitor 232 and switch S3 form a resettable integrator 200. Operational amplifier 234 includes inverting input 240 and non-inverting input 242. Non-inverting input 242 is connected to ground potential. Inverting input 240 is connected to operational amplifier output 244 through integration capacitor 232 and switch S3. Output 244 is connected to output terminal 238. Switch S2 connects inverting input 240 to input terminal 236. Switch S1 connects input terminal 236 and switch S2 to supply voltage $V_D$. Input terminal 236 connects sensing circuit 230 to data line 218. Gate line 222 connects $V_G$ to gate 216 of transistor 210. Switches S1 and S2 are used to control the voltages applied to drain contact 214. Switch S3 is used to reset integrator 280. $R_D$ represents the distributed resistance of data line 218. $C_D$ represents the distributed capacitance of data line 218. $R_G$ represents the distributed resistance of gate line 222. $C_G$ represents the distributed capacitance of gate line 222. $C_{GD}$ is the gate-drain capacitance of transistor 210. It will be noted that the ground connection for capacitor 220, which is necessary for the present invention, may be provided by, for example, grounding adjacent line 123 and/or adjacent data line 119 in FIG. 1. This is equally true for the embodiment illustrated in FIGS. 4 and 6.

Figure 3:
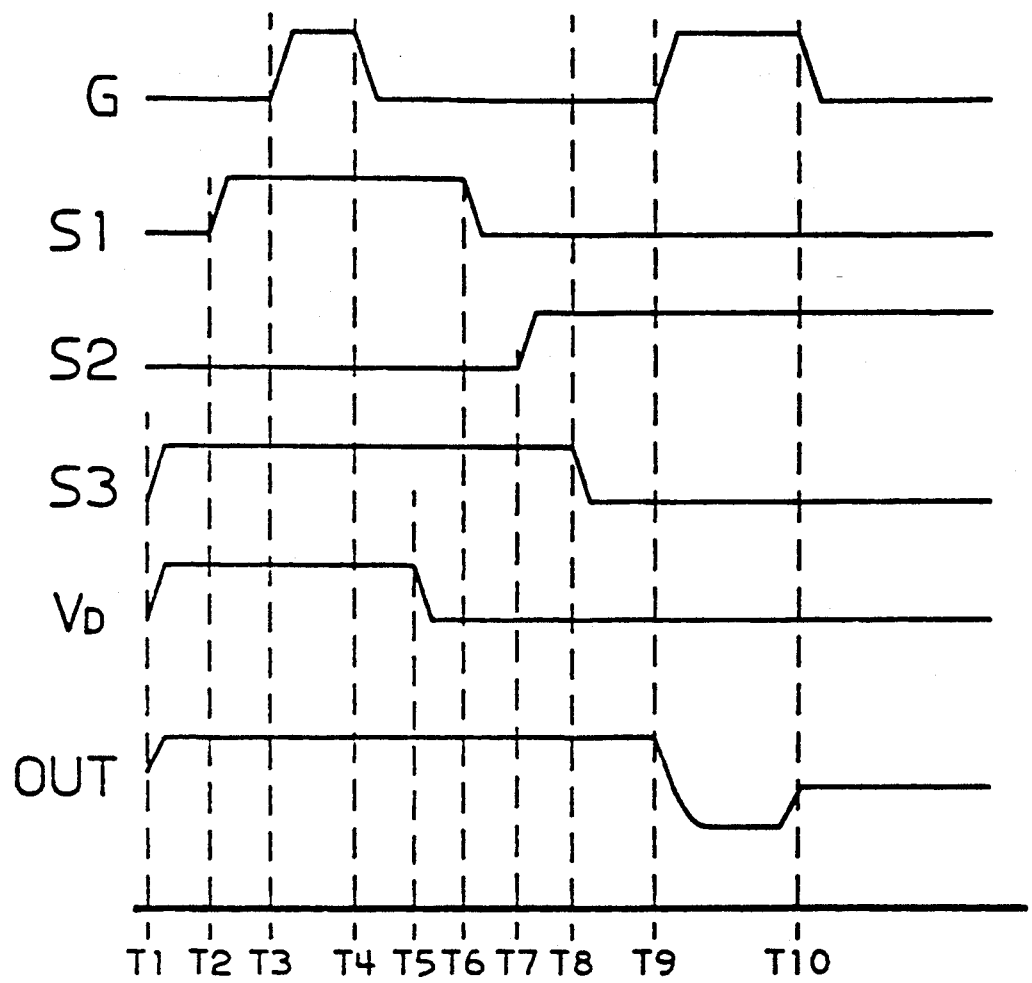
FIG. 3 illustrates a timing diagram for one embodiment of the method of the present invention.

In one embodiment of the method of testing a TFT/LCD cell according to the present invention, the circuit of FIG. 2 can be used to determine the functional quality of a cell, i.e. the ability of the cell to store charge. FIG. 3 is a timing diagram for a method of testing a TFT/LCD cell according to the present invention using the embodiment of the present invention illustrated in FIG. 2.

FIG. 3 illustrates a test sequence according to one embodiment of the present invention. The timing diagram illustrated in FIG. 3 indicates the sequence of signals applied to the switches and voltage sources in FIG. 2. Initially, that is prior to time T1 in FIG. 3, switch S1 is open, switch S2 is open, switch S3 is open, $V_G$ is at approximately ground potential and $V_D$ is at approximately ground potential. At time T1, S3 is closed, resetting the output of sense amplifier 230 to zero. Further, at time T1, $V_D$ is set to a value sufficient to charge capacitor 220 when transistor 210 is on (e.g. the maximum data voltage which would be used to driven the data line during normal operation of the displays). In conventional displays, the data line voltage may be approximately 10 volts. At time T2, S1 is closed, connecting $V_D$ to data line 218, and biasing drain 214. At time T3, $V_G$ is set to a value sufficient to turn on transistor 210, for example a value which exceeds five times the threshold voltage of transistor 210, (e.g. 15 volts), thus biasing gate contact 216 through gate line 222 and turning on transistor 210. At time T4, $V_G$ is reduced to a voltage below that required to turn on transistor 210, reducing the voltage supplied to gate contact 216 through gate line 222, and turning off transistor 210. At time T5, $V_D$ is reduced, for example, to approximately ground potential, thus discharging the charge on the distributed capacitance ($C_D$) of the data line. At time T6, switch S1 is opened, to disconnect voltage source $V_D$ from the data line. At time T7, S2 is closed, connecting transistor 210 to operational amplifier 234, thus setting sense amplifier 230 up for a sense operation. At time T8, switch S3 is opened to allow the current from data line 218 to begin charging capacitor 232. At time T9, $V_G$ is increased to a voltage sufficient to turn on transistor 210. At time T10, $V_G$ is reduced to a voltage sufficient to turn off transistor 210.

In the embodiment of the invention illustrated in FIG. 3, the period between time T9 and T10 is referred to as the integration period. In order to ensure accuracy of the test, this period will normally be at least four times the time constant of the cell. The cell time constant may be approximately by, for example, measuring the source to drain resistance $R_{DS}$ and cell capacitance (capacitor 220 in FIG. 2) of a test cell. During the integration period, S2 is closed and S1 is open, thus operational amplifier 234 holds the drain line at approximately ground potential due to virtual ground between inverting input 240 and non-inverting input 242 of operational amplifier 234. Therefore, during this period, the charge transferred to capacitor 232 is substantially equal to the charge removed from capacitor 220. Because inverting input 240 to operational amplifier 234 is a virtual ground, no charge is accumulated on drain line distributed capacitance $C_D$. This capacitance, along with drain line distributed resistance $R_D$, will, however, increase the time constant (i.e. the time required to charge capacitor 232 and discharge capacitor 220) and, thus the integration period.

During the integration period, the voltage at output terminal 238 changes due to the charge required to compensate for the rise in voltage across $C_{GD}$ and the charge removed from capacitor 232 when the gate is biased on at T9. However, at T10, transistor 210 is turned off by reducing voltage $V_G$ which removes the charge from $C_{GD}$ and reduces the voltage at output terminal 238 as illustrated in FIG. 3. Therefore, after time T10, the voltage at output terminal 238 will be substantially proportional to the charge stored on capacitor 220 at the end of the hold period ($T_9$). The output voltage may be converted to a digital word using an analog to digital converter and used to analyze various parameters of the cell. This test may be repeated a number of times for each individual cell to average out any transient errors. In addition, by selecting the appropriate gate and data lines, any cell in an array may be tested by accessing the external pads of the display. It is not necessary to mechanically access individual cells.

If a sense circuit is connected to every data line on an array, all of the transistors on a given gate line can be tested simultaneously. To check for basic function on each requires approximately 1 millisecond. Therefore, using the method of the present invention, a 1000 by 1000 array can be tested in 1 second.

It will be recognized that a portion of the voltage present at output terminal 238 after time T10 is attributable to parasitic capacitance in the test fixture. However, the effect of the parasitic capacitance may be measured and subtracted out of the voltage present at output terminal 238 to obtain a more accurate approximation of the charge on capacitor 220. The effect of the parasitic capacitance may be measured, for example, by repeating the test described above with respect to FIG. 3, omitting the steps required to turn on transistor 210 during the period between T3 to T4. Thus, at time T10, the voltage at output node 238 would represent the charge stored on any parasitic capacitance in the test fixture.

The test described above with respect to FIG. 3, will provide an indication of the functionality of the cell being addressed. By varying some of the time periods and voltages, a number of other important parameters of the cell may be defined. For example, the TFT leakage resistance is an important parameter which may be derived by plotting the measured output voltage as a function of the hold period. The period T4 to T9 is defined as the hold period and represents the period of time that the charge is held on an individual cell during a frame time in an actual display. It will be noted that the period is varied by extending the time between T4 and T9. The times T4 to T5, T4 to T6, T4 to T7 and T4 to T8 remain fixed as does the time T9 to T10. Since the capacitance of the cell may be determined by, for example, measuring the capacitance of a test cell, a logarithmic plot of the output voltage as a function of the hold time will provide an indication of the leakage resistance.

In a similar manner, the cell charging time may be determined by varying the period between time T3 and time T4 to obtain a plot of the output voltage as a function of the gate ON time (T3 to T4). Since the cell capacitance may be determined as described above, a logarithmic plot of the output voltage after T10 as a function of the gate on time provides an indication of the cell charging time, which in turn, provides an indication of the drain to source resistance $R_{DS}$ of the cell transistor.

Similarly, by varying the voltage on the data line $V_D$ and measuring the output voltage over a number of iterations of the test, it is possible to derive the threshold voltage of the transistor in the cell from a plot of output voltage as a function of data line voltage.

The circuit of FIG. 2 may be susceptible to transient currents exiting when S3 is opened at time T8. This effect may be overcome by sampling the voltage at output terminal 238 just prior to beginning the sense operation (i.e. just prior to time T9) and subtracting that voltage from the voltage at the end of the sense time (after T10), doubling the number of analog to digital (A/D) conversions required. In addition, the output range of the circuit illustrated in FIG. 2 may not be compatible with some commercial A/D converters (0 to +5 V). That is, its output may drop below the input range of the analog to digital converter. To eliminate the uncertainty resulting from transients on S3, and increase the DC bias at the output terminal 238, a further embodiment of the present invention has been developed and is illustrated in FIG. 4.

Figure 4:
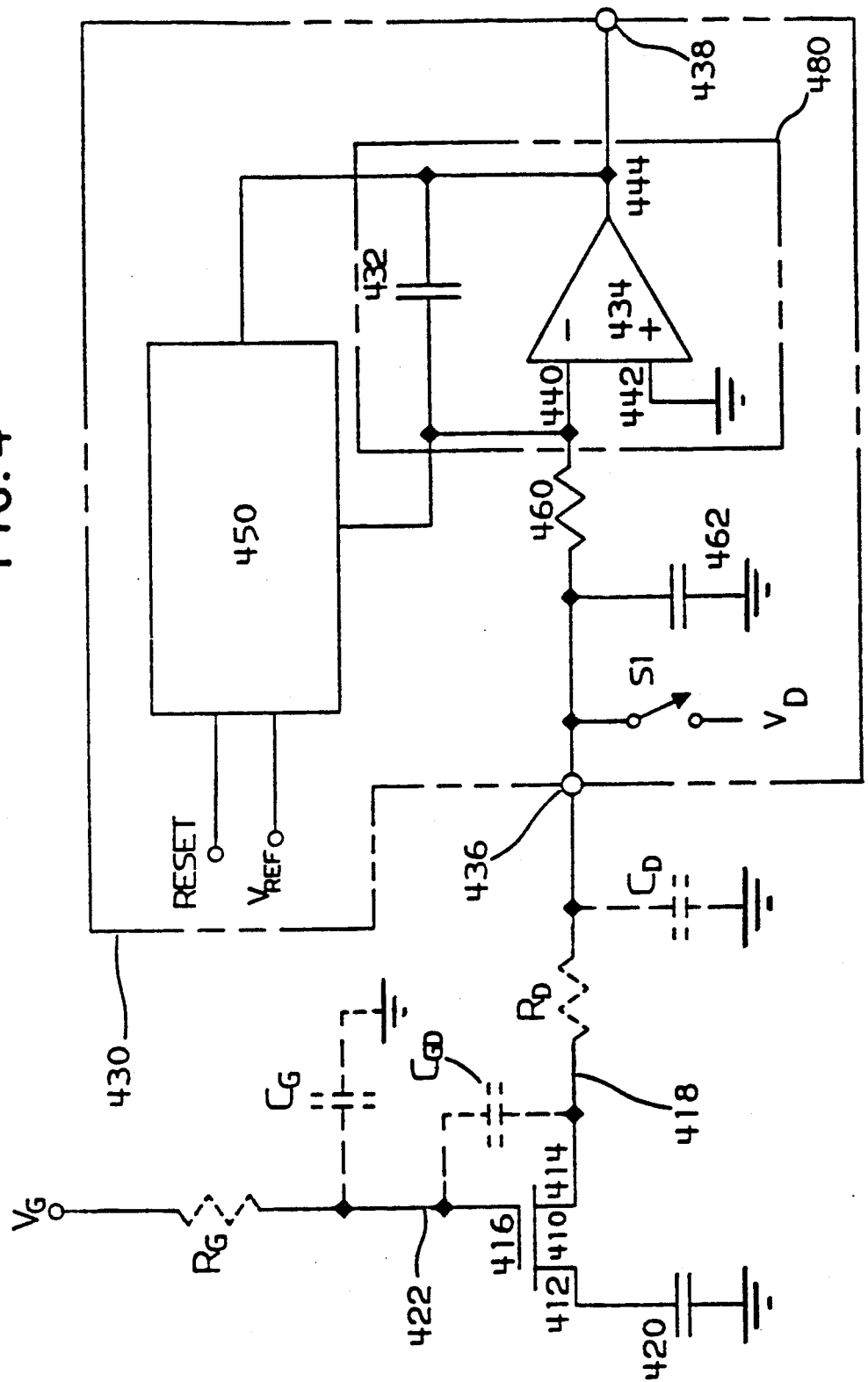
FIG. 4 illustrates a schematic diagram of one embodiment of the present invention, including a schematic diagram of a typical TFT/LCD cell.

FIG. 4 is a schematic of one preferred embodiment of the present invention attached to a typical TFT/LCD cell. The TFT/LCD cell, similar to the cell described with respect to FIG. 1, is illustrated in FIG. 4 in schematic form. In FIG. 4, a Thin Film Transistor (TFT) 410 includes source contact 412, drain contact 414 and gate contact 416. Source contact 412 supplies the Liquid Crystal Display (LCD) pad which is represented schematically in FIG. 4 by capacitor 420. Drain contact 414 is connected to data line 418. Gate contact 416 is connected to gate line 422. $C_{GD}$ in FIG. 4 represents the gate-source capacitance of transistor 410.

In the embodiment of the present invention illustrated in FIG. 4 reset control 450 is used in place of switch S3. The reset level for analog integrator 480 is controlled by reset control 450 which includes a rest reference voltage ($V_{REF}$) and a comparison circuit. $V_{REF}$ provides sense range control. In this embodiment, switch S2 is replaced by resistor 460 and capacitor 462. $R_D$ represents the distributed resistance of drain line 418, while $C_D$ represents the distributed capacitance of drain line 418. In a display comprising one million cells arrayed in rows and columns of 1000 cells, distributed capacitance may approach about 1 nF.

In the embodiment of FIG. 4, operational amplifier 434, capacitor 432 and reset control 450 form a resettable integrator. Operational amplifier 434 includes inverting input 440 and non-inverting input 442. Non-inverting input 442 is connected to ground potential. Inverting input 440 is connected to operational amplifier output 444 through capacitor 432 and reset control 450. Operational amplifier output 44 is connected to output terminal 438. Resistor 460 connects inverting input 440 to input terminal 436. Switch S1 connects input terminal 436, resistor 460 and capacitor 462 to a supply voltage $V_D$. Input terminal 436, connects sensing circuit 430 to data line 418. Switch S1 is used to control the voltages applied to drain contact 414.

Figure 5:
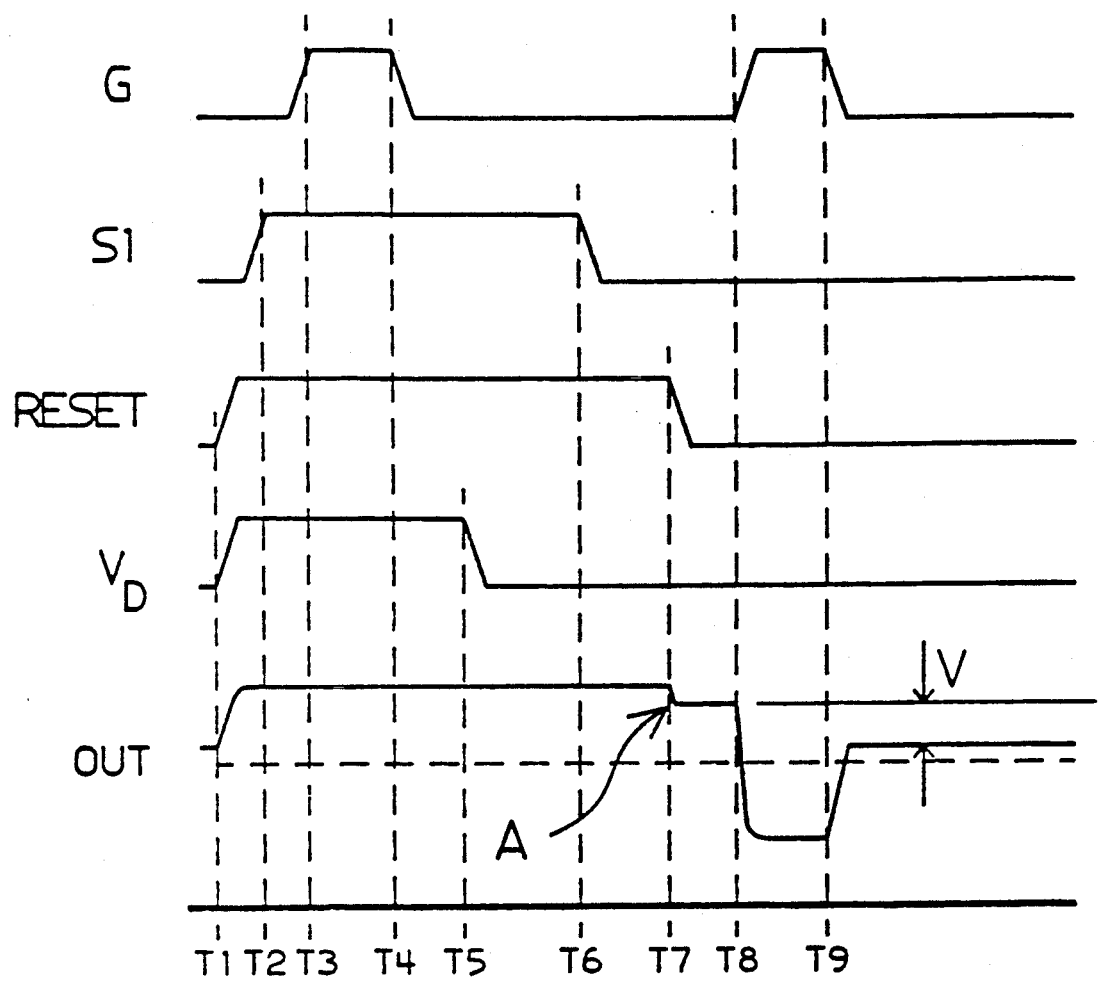
FIG. 5 illustrates a timing diagram for one embodiment of the present invention.

FIG. 5 illustrates a timing diagram for one embodiment of the method of the present invention, using the apparatus illustrated in FIG. 4. All times referred to in the following description relate to the times illustrated in FIG. 5. Prior to T1, switch S1 is open, the RESET signal is raised, $V_G$ is at approximately ground potential and $V_D$ is at approximately group potential. The first step in a single charge test is to stabilize the data voltage at the value desired for the test. Thus, at T1, the data voltage $V_D$ is set to a value sufficient to charge capacitor 420. Data voltage $V_D$ should, preferably, be adjustable over the full range of values used in display operation. For a typical TFT/LCD, using a twisted nematic liquid crystal, this data voltage may range from approximately zero to eleven volts. In some displays the data voltage may reach approximately fourteen volts. At time T1, transistor 410 is held OFF by the voltage at gate 416 ($V_G$), switch S1 is open to disconnect the data line from a data voltage $V_D$, and a switch (not shown in FIG. 4) controlled by the RESET signals, is closed to reset output 444 of integrator 480 to a preselected level. This preselected level, defined by $V_{REF}$, is approximately the center of the A/D range (e.g. 4 volts). At time T2, switch S1 is closed, connecting data voltage ($V_D$) to data line 418. This state is held for at least a time constant $\tau_{DATALINE}$ of data line 418. The data line time constant is $\tau_{DATALINE}$ ($\tau_{DATALINE}=R_D C_D$) where $R_D$ is the data line resistance and $C_D$ is the data line capacitance.

At time T3, gate voltage $V_G$ is turned on. The gate ON voltage should be greater than the threshold voltage of the thin film transistor to insure that the transistor channel will turn on, conversely, the gate OFF voltage should be chose to be less than the threshold voltage of the transistor to insure that the transistor channel is biased off. The width of the gate pulse should be greater than the time constant of a gate line ($\tau_{GATELINE}=R_G C_G$). At time T4, the end of the gate pulse, the tester enters a hold time (T4 to T8), during this period the charge that has been transferred to the cell is stored on capacitor 420. This period emulates an actual display, where charge is stored on the cell capacitance for at least a line time. For a display with N gate lines, and with M refresh cycles per second, the gate pulse width should be $\tau_{GATEPULSE}=1/(N*M)$, and the hold time would be approximately 1/M. For a typical 1000 gate line display operating at 100 Hertz refresh, the gate pulse width would be 10 microseconds, and the hold time would be 10 milliseconds. During the hold time, the data voltage $V_D$ is returned to zero volts at time T5. At time T6, the data line is disconnected from the data voltage source by opening switch S1. In order to ensure proper operation, T6 is delayed from the trailing edge of the gate pulse by at least one gate line time constant ($\tau_{GATELINE}$). Since data line 418 is connected to inverting input 440 of operational amplifier 480, which is a virtual ground, the voltage on the data line relaxes to ground which requires at least 1 data line time constant ($\tau_{DATALINE}$). After the data line voltage has relaxed to ground, at time T7, capacitor 432 is released from the reset voltage level maintained by reset control 450. Thus, at time T7, integrator 480 will begin to integrate the current into the inverting input of operational amplifier 434. At T8, the end of the hold time, the gate voltage is turned on to a level greater than the threshold voltage of the thin film transistor, insuring that the transistor channel ohmically connects the cell capacitance to the data line. Between T7 and T8 the voltage at output 438 drops to a level (A in FIG. 5), which is due to a transient caused by opening the switch controlled by the RESET signal. The gate voltage is turned on at T8 and is held on until T9 for several cell discharge time constants to insure that all of the charge on the cell capacitance can return to the operational amplifier virtual ground and be integrated by capacitor 432. At T9, gate voltage $V_G$ is reduced, turning off transistor 410. This voltage may be measured immediately. However, it is normally better to wait for at least a gate line time constant ($\tau_{GATELINE}$). The difference in voltage between the output just before time T8 and the output after time T9 of the analog to digital converter is substantially proportional ($Q_{cell}=(V_{A/D}-V_{RESET})C_1$) to the charge on the cell capacitance 420.

The gate ON time (T3 to T4) can be varied to determine the amount of charge that is transferred to the cell. This data can be used to calculate the charging time constant for a cell.

Reset circuit 450 is designed to hold the output of the operational amplifier at a fixed potential ($V_{RESET}$) during the period T1 to T7. The output of operational amplifier 434 is controlled by the integrated circuit into the inverting input after T7.

Figure 6:
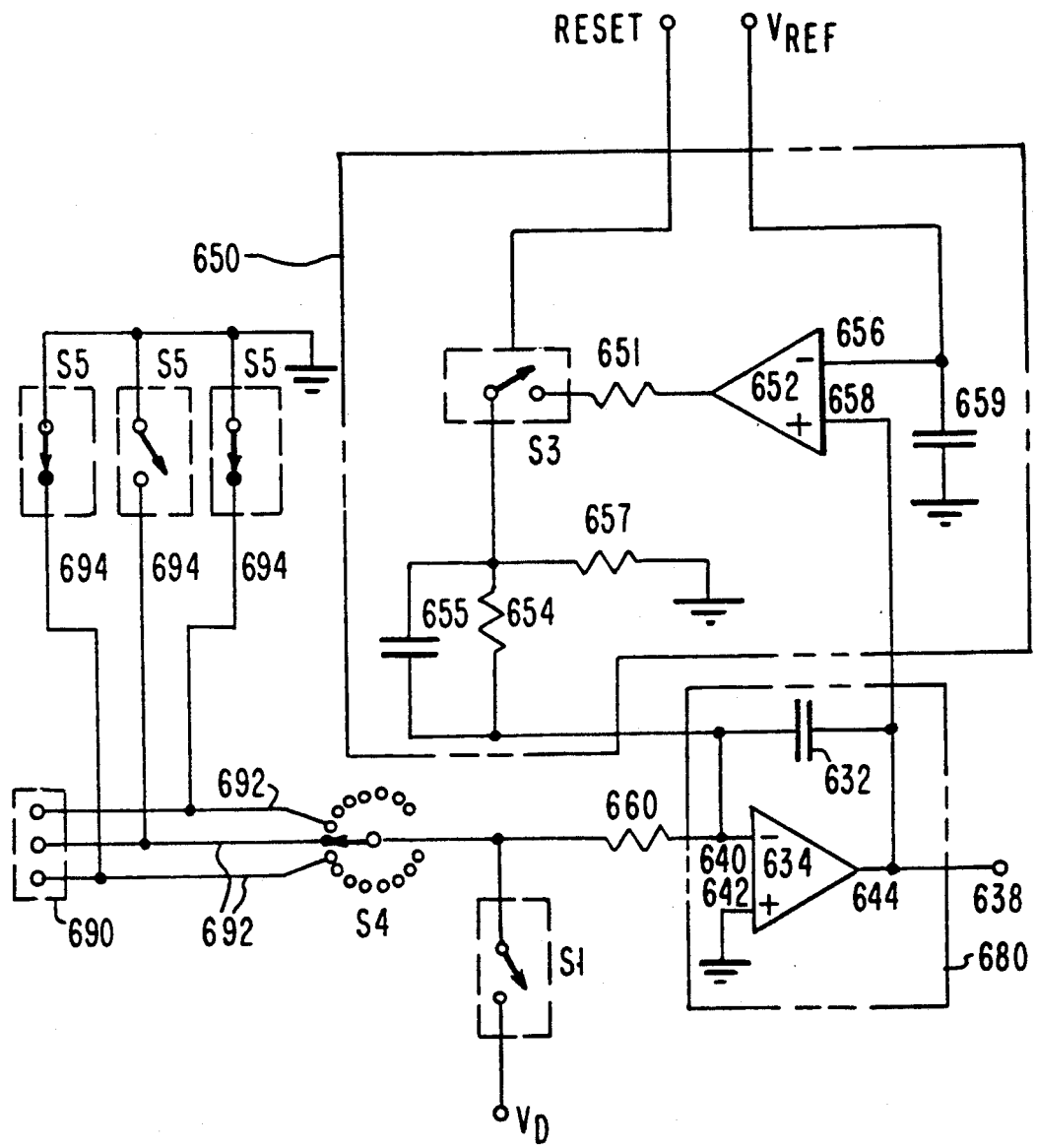
FIG. 6 illustrates a further embodiment of the present invention.

FIG. 6 is a schematic of a further preferred embodiment of the present invention. The data lines of the TFT/LCD array to be tested are connected to the test circuit through connector 690. Analog multiplex switch S4 is used to select an individual data line to be connected to the test circuit through line 692. Analog multiplex switch S4 may be, for example a MUX16 analog multiplex switch from Precision Monolithic Integrated Circuits. The data lines are further connected through connector 690 to lines 694 which are individually connected to switches S5. Switch S5 may be, for example a SW202 analog switch from Precision Monolithic Integrated Circuits. Since the test circuit in FIG. 6 is connected to only one data line at a time, switches S5 may be used to ground the nonselected switches, thus ensuring a good ground reference for the cell capacitance even when the backplate is removed. The data line selected by switch S4 is not grounded since its S5 switch is held open during the test period. The data line selected by S4 is connected to $V_D$ through switch S1 and to operational amplifier 634 through resistor 660. Resistor 660 may be, for example, 10 thousand ohms. Operational amplifier 634 may be, for example, an OP-17. The non-inverting input 642 of operational amplifier 634 is connected to ground potential, thus creating a virtual ground at inverting input 640. Inverting input 640 is connected to capacitor 632 which is also connected to operational amplifier output 644 and acts as an integrating capacitor. Capacitor 632 may be, for example, on the order of 5 picofarads. However, its size will normally be determined by the desired amplitude of the integrator output voltage. Operational amplifier 634 in combination with capacitor 632 comprise integrator 680. Since the voltage across capacitor 632 must be reset after each test, reset circuit 650 is provided. Reset circuit 650 has two input signals, $V_{REF}$ and RESET. Since switch S3 is controlled by the RESET signal, the level of the RESET signal must be sufficient to drive S3. S3 may be, for example, a SW202 from Precision Monolithic Integrated Circuits which requires normal TTL levels. $V_{REF}$ is a voltage level which supplies a reference signal to the inverting input of operational amplifier 652. Operational amplifier 652 may be, for example, an OP-16. $V_{REF}$ is also connected to ground potential through capacitor 659. Capacitor 659 acts as a noise filter and may be, for example, 0.1 microfarads to effectively remove AC noise from the reference voltage. The non-inverting input of operational amplifier 652 is connected to one side of capacitor 632 and to output 644 of operational amplifier 634. The output of operational amplifier 652 is connected to resistor 651 which in turn is connected to one terminal of switch S3. Resistor 651 may be, for example 4.99 thousand ohms. The other terminal of S3 is connected to ground through resistor 657 and to capacitor 632 through the parallel combination of resistor 654 and capacitor 655. Resistor 657 may be, for example 4.02 thousand ohms. Resistor 654 may be, for example, 3.01 thousand ohms. Capacitor 655 may be, for example, 3 picofarads. Thus, the combination of reset circuit 650 and integrator 680 form a resettable integrator.

It will be apparent to those of skill in the art that reset circuit 650, described with respect to FIG. 6 may be substituted for reset circuit 450 in FIG. 4, as a means of implementing the embodiment of FIG. 4.

In short, the method of the present invention is designed to store charge in the active area of a particular TFT/LCD cell. The electrical characteristics of the cell may then be calculated by reading the charge stored on the active area after a period of time. More particularly, in a backplane tester according to one embodiment of the present invention charge is stored on the cell through a series of switches while an operational amplifier is employed in an inverting, integrating mode to detect the charge stored on the cell. When utilized according to the method of the present invention, this arrangement provides a means of reliably and accurately measuring the charge on the liquid crystal pad capacitance.

In the method of the present invention, the measurement resolution may be improved by sequencing the test steps to minimize the effect of gate to source coupling through $C_{GD}$ coupling. The resolution may be further improved by subtracting out the parasitic capacitance introduced by the test fixture. This parasitic capacitance may be measured by turning of the transistor during the charge cycle and measuring the output voltage. Since the output voltage is proportional to the parasitic capacitance of the test fixture, that voltage may be subtracted off the voltage measured during normal testing. In the method of the present invention, the resolution may be further improved by running the test several times and averaging the output voltages measured to remove random error from the measurements.

In LCD displays which do not use storage capacitors (as in FIG. 1) the primary capacitance measured by the method according to the present invention is the pad to adjacent gate line capacitance. It is desirable to minimize this capacitance in the design of conventional TFT/LCD's to decrease the charging time. Unfortunately, this reduces the accuracy of the test method according to the present invention. In order to increase the measured charges, utilizing the method of the present invention, the pel capacitance can be doubled by testing alternate columns of devices, thus utilizing the capacitance to the adjacent drain line as well as that of the adjacent gate line. For an 80 pixel per inch display and using a gap of 10 microns, the total parasitic capacitance may be expected to be approximately 0.05 pF, and for a 160 pixel per inch display and using a gap of ten microns, the capacitance would be expected to be approximately 0.025 pF.

In one preferred embodiment of the present invention, a sixteen pole analog multiplexor is used to select one out of sixteen data lines to test. The other fifteen data lines are grounded using analog switches. Thus the output voltage will be proportional to the charge stored on one cell along the selected data line. The cell is determined by selecting the gate line.

In FIG. 6, switch S3 may be an analog switch (typically an SW202 from Precision Monolithic Incorporated, PMI) to either connect or disconnect the output node of an operational amplifier (typically an OP16 from PMI) to the inverting input of the integrating operational amplifier (typically an OP17 from PMI), the non-inverting output of the OP16 operational amplifier is connected to the output of the OP17, the inverting input of the OP16 is connected to the $V_{REF}$. When S2 is closed the potential across the integrating capacitor, C1, is held fixed at $V_{RESET}$, when S2 is open the integrating capacitor is allowed to integrate the current from the data line of the display.

An analog method of testing TFT arrays cell capacitance for use in LCD displays, has been described. This method provides significant advantages over conventional digital test methods. In addition, techniques have been described to minimize parasitic effects and noise induced errors. Finally, test sequences have been described which utilize the method according to the present invention to test for GO/NOGO, threshold voltage, transconductance, leakage current, and $C_{GS}$.

It is known that, a photosensitive element such as an amorphous silicon resistor, could be added to the LCD cell to charge or discharge the LCD capacitor (see U.S. Pat. No. 4,819,038). It will be apparent that a circuit according to the present invention could be used to detect the change in charge on the capacitor. Thus, the present invention could be used to construct an input device.

While preferred embodiments of the present invention have been shown and described herein, it will be obvious to those skilled in the art that such embodiments are provided by way of example only. Numerous variations, changes, and substitutions will now occur to those skilled in the art without departing from the invention. Accordingly, it is intended that the invention be limited only by the spirit and scope of the appended claims.

We claim:

1. A sense circuit for detecting charge on a TFT/LCD cell capacitor, comprising:
    a first, integrating circuit attached to said TFT/LCD cell capacitor through a data line, wherein said data line is connected to said cell capacitor through a thin film transistor;

said thin film transistor including a gate, a drain and a source, wherein said source is connected to said cell capacitor and said drain is connected to said data line;

a supply for supplying energy for driving said gate of said thin film transistor;

a reset circuit adapted to reset said integrating circuit; and means for depositing said charge on said cell capacitor at a predetermined time.

2. A sense circuit according to claim 1 wherein:

said integrating circuit comprises a first operational amplifier including an output, an inverting input and a non-inverting input and a capacitor connected from said inverting input to said output of said operational amplifier, and said reset circuit is connected across said capacitor.

3. A sense circuit according to claim 2 wherein:
said reset circuit comprises a switch.

4. A sense circuit according to claim 3 wherein:

said reset circuit comprises a second operational amplifier connected to a switch, wherein said second operational amplifier includes an inverting input, a non-inverting input, and an output;

one side of said switch being connected to said inverting input of said first operational amplifier and an opposite side of said switch being connected to said output of said second operational amplifier;

said inverting input of said second operational amplifier being connected to a reference voltage;

said non-inverting input of said second operational amplifier being connected to the output of said first operational amplifier;

said switch including an enable input, wherein, said enable input opens or closes said switch; and said enable input being connected to a reset signal.

5. A circuit according to claim 1 wherein:

said means for depositing charge comprises a resettable switch connecting a variable voltage supply to said data line.

6. A circuit according to claim 1 wherein the cell capacitor comprises a capacitance of an electrode associated with the cell.

7. A circuit according to claim 6 wherein the cell capacitor comprises a capacitance of a storage capacitor associated with the cell.

8. A method of testing a TFT/LCD including a cell comprised of a cell capacitor, and a thin film transistor including a gate, a source and a drain, wherein said drain is connected to said cell capacitor, using a sense circuit comprising an integrator means and reset means wherein said integrator means is selectively coupled to said drain through a data line, said method comprising the steps of:

turning off said thin film transistor by applying a first predetermined gate voltage to said gate;

resetting said integrator using said reset circuit;

raising the voltage on said drain to a value sufficient to charge said cell capacitor;

applying a second predetermined gate voltage to said gate sufficient to turn on said transistor;

waiting a first predetermined time period sufficient to charge said cell capacitor to a predetermined test value;

applying said first gate voltage to said gate to turn said transistor off;

waiting a second predetermined period of time;

lowering said voltage on said drain to approximately ground potential during said second period of time;

disconnecting said voltage on said drain during said second period of time;

applying said second gate voltage to said gate to turn said transistor on;

waiting a third predetermined period of time;

applying said first gate voltage to said gate to turn said transistor off;

measuring a potential at an output of said integrator means.

9. A method according to claim 8 wherein:

said first predetermined time is at least one time constant of said gate line;

said second predetermined time is at least a period of time equal to a hold time;

said third predetermined time is at least two cell discharge time constants.

10. A method of testing thin film transistors using a test circuit, said thin film transistor comprising:

a gate connected to a gate terminal through a gate line;

a drain connected to a drain terminal through a data line;

a source connected to a cell capacitance through a source terminal;

said test circuit, including an input terminal and an output terminal and comprising:

an operational amplifier including non-inverting and inverting input terminals and an output terminal, said output terminal being connected to said test circuit output terminal and said non-inverting terminal being connected to a ground potential;

an integrating capacitor connected between said inverting input terminal and said output terminal;

a first controllable switch connected between a first potential and said test circuit input terminal;

a second controllable switch connected between said inverting input terminal and said test circuit input terminal;

a third controllable switch connected between said inverting input terminal and said test circuit output terminal;

said method comprising the steps of:

opening said second switch;

closing said third switch;

closing said first switch;

waiting a first predetermined time period, wherein said first time period corresponds to a time constant of said data line;

applying a voltage to said gate terminal sufficient to bias said transistor on;

waiting a second predetermined time period, wherein said second time period corresponds to the test time period for said thin film transistor;

applying a voltage to said gate terminal sufficient to bias said transistor off;

closing said second switch for a third predetermined time period, corresponding to a test hold time;

open said third switch after a fourth predetermined time period;

applying a voltage to said gate sufficient to turn said transistor on;

waiting a fifth predetermined time sufficient to transfer charge from said cell capacitance to said integrating capacitor;

applying a voltage to said gate sufficient to turn said transistor off;

waiting a sixth predetermined time, corresponding to the RC time constant of said gate line;
sampling said output node.

11. A sense circuit according to claim 1 wherein said supply provides sufficient energy to turn on said thin film transistor.

12. A circuit for electrically activating and measuring characteristics of a cell of a liquid crystal display, wherein said cell has associated therewith a cell capacitor and a thin film transistor, said thin film transistor having a source, a gate and a drain, said circuit comprising:
means for supplying energy for driving the gate of said thin film transistor,
means for supplying charge through said source and drain of said thin film transistor to said cell capacitor at a predetermined time;
an integrating circuit coupled to said cell capacitor for integrating voltage thereon; and
a reset circuit for resetting said integrating circuit prior to integrating.

13. A circuit according to claim 12 wherein said integrating circuit is connected to said cell capacitor by a data line, said data line being electrically connected to said thin film transistor.

14. A circuit according to claim 12 wherein:
said integrating circuit comprises an operational amplifier including an output, an inverting input and a non-inverting input and a capacitor connected from said inverting input to said output of said operational amplifier; and
said reset circuit is connected across said capacitor.

15. A circuit according to claim 14 wherein:
said reset circuit comprises a second operational amplifier connected to a switch, wherein said second operational amplifier includes inverting input, a non-inverting input, and an output,
one side of said switch being connected to said inverting input of said first operational amplifier and an opposite side of said switch being connected to said output of said second operational amplifier;
said inverting input of said second operational amplifier being connected to a reference voltage;
said non-inverting input of said second operational amplifier being connected to the output of said first operational amplifier;
said switch including an enable input, wherein, said enable input opens or closes said switch; and
said enable input being connected to a reset signal.

16. A circuit according to claim 12 wherein said means for supplying charge comprises a variable voltage power supply and a resettable switch for connecting said variable voltage power supply to a data line, said data line being connected to said drain of said thin film transistor.

17. A circuit according to claim 12 wherein the cell capacitor comprises capacitance of an electrode associated with the cell.

18. A circuit according to claim 17 wherein the cell capacitor further comprises a capacitance of a storage capacitor associated with the cell.

19. A circuit according to claim 12 further comprising a test fixture for connecting said cell to said integrating circuit.

20. A circuit according to claim 12 further comprising a test fixture for connecting a plurality of cell capacitors of a plurality of cells of a liquid crystal display to said integrating circuit.

21. A circuit according to claim 20 further comprising means for sequentially connecting successive ones of said cell capacitors to said integrating circuit.

22. A circuit according to claim 20 wherein a respective thin film transistor of each of said cells has a data line electrically connected to a respective drain of said thin film transistor, and said test fixture electrically connects said integrator to said data line.

23. A method for electrically testing a liquid crystal display cell having a cell capacitor and a thin film transistor associated therewith, wherein said thin film transistor has a source, a gate and a drain, said method comprising the steps of:
supplying energy for driving the gate of said thin film transistor;
depositing charge through said source and drain of said thin film transistor on said cell capacitor at a predetermined time;
integrating a voltage level on said cell capacitor over a period of time by using an integrator coupled to said cell capacitor; and
resetting the integrator before integrating.

24. A method according to claim 23 wherein the cell capacitor comprises a capacitance of an electrode associated with the cell.

25. A method according to claim 24 wherein the cell capacitor further comprises a capacitance of a storage capacitor associated with the cell.

26. A method for electrically testing a liquid crystal display cell having a cell capacitor and a thin film transistor associated therewith, wherein said thin film transistor has a source, a gate and a drain, the method comprising:
electrically connecting said liquid crystal display cell to said integrator with a test fixture;
supplying energy for driving the gate of said thin film transistor;
depositing charge through said source and drain of said thin film transistor on said cell capacitor at a predetermined time;
integrating a voltage level on said cell capacitor over a period of time by using an integrator coupled to said cell capacitor to produce a first integrated voltage;
resetting the integrator before integrating off;
depositing charge on a portion of said test fixture used to electrically connect said integrator to said cell and on a data line of said cell;
resetting said integrator;
integrating a voltage level on said portion of said test fixture and said data line over a period of time to produce a second integrated voltage; and
subtracting said second integrated voltage from said first integrated voltage.

27. A method according to claim 23 further comprising the steps of:
discontinuing depositing charge on said cell capacitor;
supplying said energy for driving said gate so as to turn on said thin film transistor for a predetermined time interval at a predetermined time after discontinuing depositing charge on said cell capacitor;
commencing integration by said integrator before driving said gate;
determining a first integrated voltage just prior to driving said gate;
determining a second integrated voltage after driving said gate for a period of time sufficient for substantially all charge on said cell capacitor to be transferred to said integrator and after said predetermined time interval has elapsed, so as to determine a second integrated voltage; and subtracting said second integrated voltage from said first integrated voltage to determine a difference voltage substantially proportional to charge stored on said cell capacitor.

28. A method according to claim 23 wherein during said step of supplying energy for driving said gate, sufficient energy is supplied to turn on said thin film transistor.

* * * * *